US011429759B2

(12) United States Patent
Apte et al.

(10) Patent No.: US 11,429,759 B2
(45) Date of Patent: Aug. 30, 2022

(54) METHOD FOR SELECTING MULTIPLE EDGES AND FACES IN MODELED OBJECT

(71) Applicant: Dassault Systemes SolidWorks Corporation, Waltham, MA (US)

(72) Inventors: Makarand Apte, Maharashtra (IN); Nikhil Amrutham, Hinjewadi (IN); Jody Stiles, Northborough, MA (US); Girish Mule, Wakad (IN); Shrikant Savant, Shrewsbury, MA (US); Chin-Loo Lama, Bolton, MA (US)

(73) Assignee: Dassault Systemes SolidWorks Corporation, Waltham, MA (US)

( * ) Notice: Subject to any disclaimer, the term of this patent is extended or adjusted under 35 U.S.C. 154(b) by 0 days.

(21) Appl. No.: 17/084,959

(22) Filed: Oct. 30, 2020

(65) Prior Publication Data

US 2021/0150079 A1    May 20, 2021

(30) Foreign Application Priority Data

Nov. 18, 2019  (IN) .............................. 201941046868

(51) Int. Cl.
*G06F 30/10*    (2020.01)
*G06T 7/13*    (2017.01)
(Continued)

(52) U.S. Cl.
CPC ............ *G06F 30/10* (2020.01); *G06F 3/0482* (2013.01); *G06F 3/04815* (2013.01); *G06T 3/403* (2013.01); *G06T 7/13* (2017.01); *G06T 19/20* (2013.01); *G06T 2200/24* (2013.01); *G06T 2219/2016* (2013.01)

(58) Field of Classification Search
CPC .............................................. G06T 2219/2016
See application file for complete search history.

(56) References Cited

U.S. PATENT DOCUMENTS

2002/0147703 A1* 10/2002 Yu ....................... G06F 16/2264
2008/0215510 A1*  9/2008 Regli ..................... G06T 19/00
706/12

(Continued)

FOREIGN PATENT DOCUMENTS

WO    2015/148332    10/2015
WO    2016135674    9/2016

OTHER PUBLICATIONS

Volker Turau; "Fixed-radius near neighbors search;" Information Processing Letters, vol. 39, Issue 4 (1991), pp. 201-203, North-Holland, Aug. 30, 1991 (Year: 1991).*

(Continued)

*Primary Examiner* — Edward Martello
(74) *Attorney, Agent, or Firm* — Sheehan Phinney Bass & Green PA

(57) ABSTRACT

A method for selecting a plurality of edges or faces of a displayed modeled object in a computer-aided design (CAD) system extracts a plurality of features, each feature including a measurable numeric property of one or more of edges or faces of the modeled object. The features are scaled, and a selection of a seed edge or a seed face is received. A suggested edge or face is chosen based upon the seed edge or seed face, and a graphical indication of the suggested edge or face is displayed on the modeled object.

13 Claims, 16 Drawing Sheets

(51) Int. Cl.
*G06F 3/04815* (2022.01)
*G06F 3/0482* (2013.01)
*G06T 3/40* (2006.01)
*G06T 19/20* (2011.01)

(56) References Cited

U.S. PATENT DOCUMENTS

| | | | |
|---|---|---|---|
| 2015/0269284 A1* | 9/2015 | Mattson | G06F 30/00 703/1 |
| 2016/0162603 A1 | 6/2016 | Schriesheim et al. | |
| 2016/0246899 A1* | 8/2016 | Hirschtick | G06F 30/17 |
| 2020/0218835 A1* | 7/2020 | Baran | G06T 19/20 |

OTHER PUBLICATIONS

Baker et al.; "Parametric Feature Detection;" International Journal of Computer Vision 27(1), pp. 27-50 (1998); Kluwer Academic Publishers, The Netherlands (Year: 1998).*

Extended European Search Report for EP20206192.5 dated Apr. 29, 2021.

Zhu, H et al; "B-Rep Model Simplification by Automatic Fillet/round suppressing for efficient automatic feature recognition"; computer-aided design, elsevier publishers BV, vol. 34, No. 2, Feb. 1, 2002.

Adhikary Nepal et al; "A slice based approach to recognize and extract free-form volumetric features in a CAD mesh model"; Computer-Aided Design and Applications, vol. 13, No. 5, Mar. 3, 2016 pp. 587-599.

* cited by examiner

US 11,429,759 B2

METHOD FOR SELECTING MULTIPLE EDGES AND FACES IN MODELED OBJECT

CROSS-REFERENCE TO RELATED APPLICATION(S)

This application claims the benefit of priority to Indian Patent Application No. 201941046868, entitled Method for Selecting Multiple Edges and Faces In Modeled Object, which was filed on Nov. 18, 2019. The disclosure of the prior application is incorporated by reference herein in its entirety.

FIELD OF THE INVENTION

The present invention relates to computer-aided design, and more particularly, is related to selection of multiple geometries in two dimensional (2D) and three dimensional (3D) product design.

BACKGROUND OF THE INVENTION 3D design software applications such as CAD (computer-aided design) programs are used for building solid geometry of the products being designed. Solid geometry is created by defining multiple surfaces that intersect with other such surfaces. Wherever two or more geometric surfaces meet each other, sharp edges may be created which may need to blunted for better usability and aesthetics of the product, which involves modeling operations like filleting and chamfering. Filleting and chamfering operations generally involve multiple edges being selected and rounded using fillets and chamfers. Even for a moderately complex model, this can result in selection of many hundreds of edges resulting in a tedious and time consuming task.

For example, FIG. 1 shows a 3D modeled object 100 having a first edge (corner section) 110, shown inside a dashed box. The modeled object 100 has multiple similar edges 112 that are similar to the first edge but are displaced and/or rotated with respect to the first edge 110. In a scenario where a user wishes to perform a similar modification to multiple edges or all of the edges 110, 112, the user typically has to first select the first edge 110, and subsequently each of the desired similar edges 112. In some instances, a hidden edge 114 similar to the edges 110, 112 may be hidden from the view where the user is selecting edges, further complicating the selection process. Therefore, there is a need in the industry to address the above identified shortcomings.

SUMMARY OF THE INVENTION

Embodiments of the present invention provide a method for selecting multiple edges and faces in a modeled object. Briefly described, the present invention is directed to a method for selecting a plurality of edges or faces of a displayed modeled object in a computer-aided design (CAD) system. A plurality of features are extracted, each feature including a measurable numeric property of one or more of edges or faces of the modeled object. The features are scaled, and a selection of a seed edge or a seed face is received. A suggested edge or face is chosen based upon the seed edge or seed face, and a graphical indication of the suggested edge or face is displayed on the modeled object.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1:
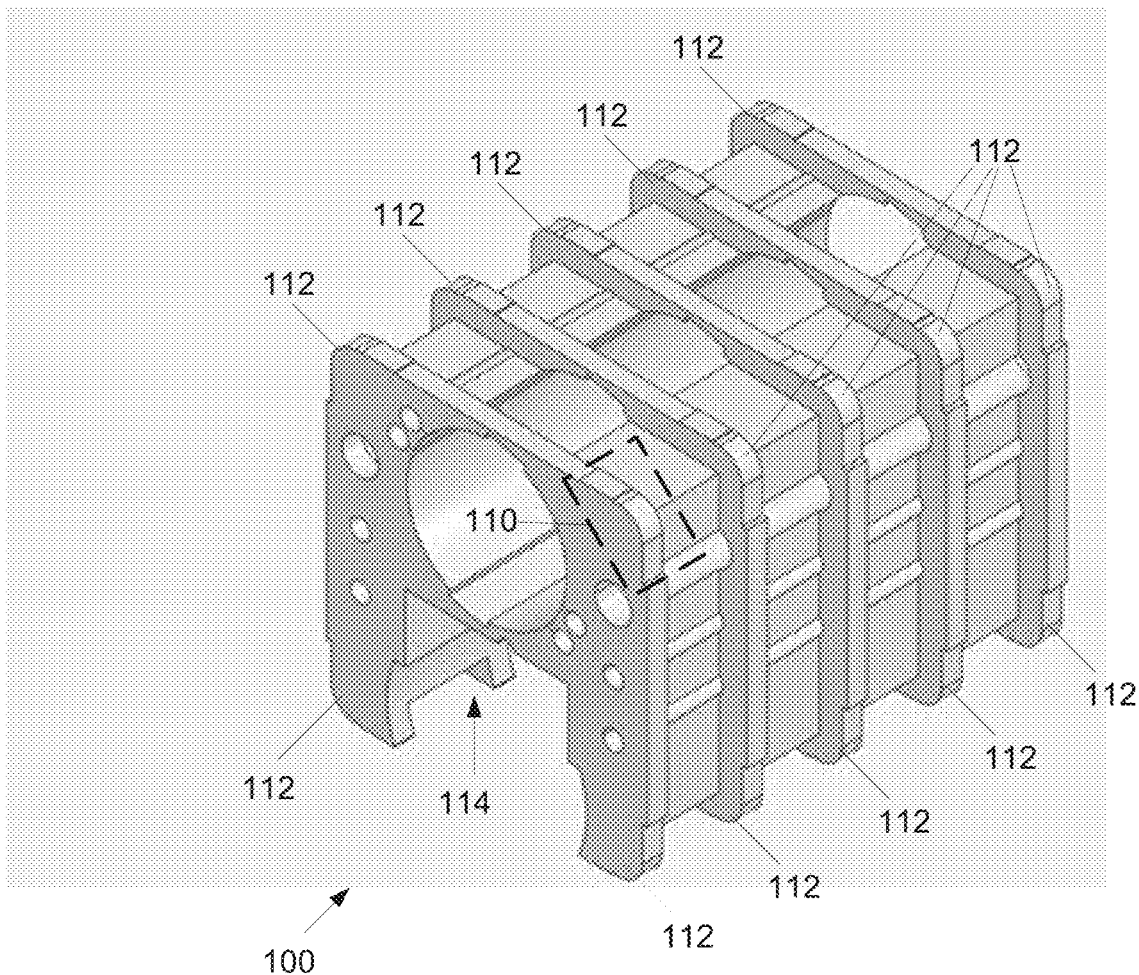
FIG. 1 is a schematic diagram showing a 3D modeled object with multiple similar edges.

The following definitions are useful for interpreting terms applied to features of the embodiments disclosed herein, and are meant only to define elements within the disclosure.

As used within this disclosure, a "chamfer" refers to a sloped or angled corner or edge of a modeled object, and a "fillet" refers to a rounded corner or edge. A chamfer and/or fillet may refer to an edge located on either the interior or the exterior of the modeled object. Edges that can be filleted or chamfered are said to be CO or GO continuous, meaning that they are connected at a common vertex but are not tangent to each other.

As used within this disclosure, a 'feature' refers to a descriptor or a measurable numeric property of an edge or a face of a modeled object. This interpretation is motivated from the common usage of the word 'feature' in statistics and machine learning literature, not to be confused with the phrase 'topological feature' used in the context of CAD.

This disclosure is directed to manipulation of a computer modeled object. Herein, references to manipulating an object generally will refer to manipulating, via a user interface, an image of the modeled object on a display screen. Examples of such manipulation of the modeled object include selecting, rotating, scaling, etc. It is understood that manipulations of the displayed modeled object results in manipulation by computer software of data objects representing aspects and topological features of the modeled object. Reference will now be made in detail to embodiments of the present invention, examples of which are illustrated in the accompanying drawings. Wherever possible, the same reference numbers are used in the drawings and the description to refer to the same or like parts. While the description of the embodiments generally refers to a 3D modeled object, the description is similarly applicable to a 2D modeled object.

As noted in the background section, in a CAD environment when a user makes a modification to a certain edge or a face of a modeled 3D object, the user often also needs the same modification made to all similar edges or faces in the 3D modeled object. In order to make the same modification to multiple edges or faces of a modeled 3D object, the user must first select all those edges or faces, and then instruct the CAD system to create topological features or edit topological features for all the selected edges or faces. Previously, this has been a tedious and/or time consuming process. The disclosed embodiments of the present invention address reducing the drudgery behind selecting many edges one at a time or a few at a time, which is a common task for many modeling operations in 3D design software. Under the embodiments described here, whenever a user selects an edge or a face in a modeled object, the embodiments provide for automatic and instant selection of all edges or faces in that modeled object that are similar to the selected edge or face in shape, while allowing ease of use and flexibility.

The embodiments incorporate a Selection Helper module to make the task of selecting edges easy, quick and more efficient. Moreover, the Selection Helper module captures the design intent by taking into account not just quantitative but also qualitative factors. As described further below, the Selection Helper module makes suggestions to the user in a very user-friendly, simple, yet effective interface that is available at the point of selection without being obtrusive.

Figure 2A:
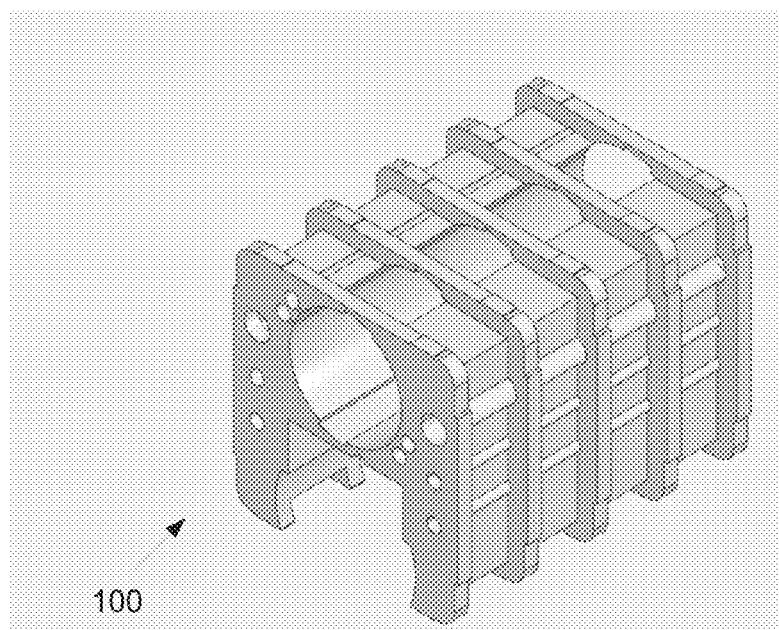
FIG. 2A is a screen capture of a 3D modeled object under a first embodiment of the present invention.
Figure 2B:
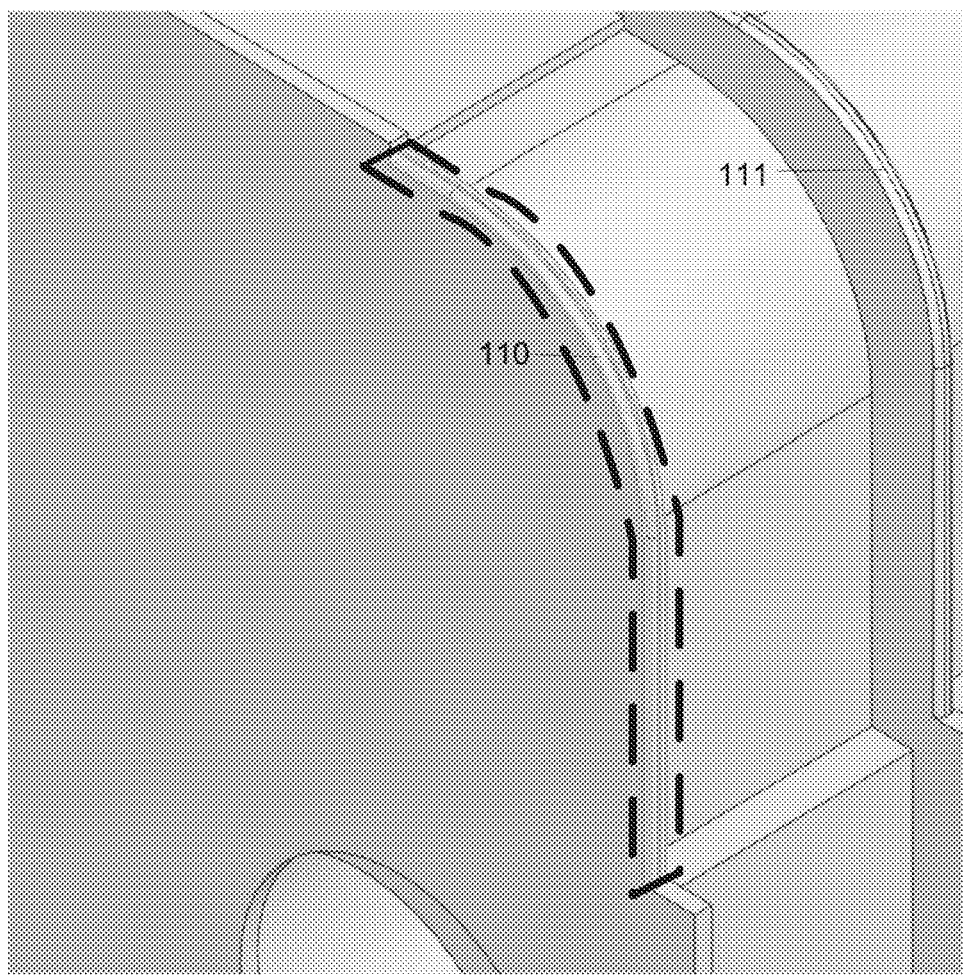
FIG. 2B is an edge detail of a screen capture of the 3D modeled object of FIG. 2A showing resultant fillets.
Figure 2C:
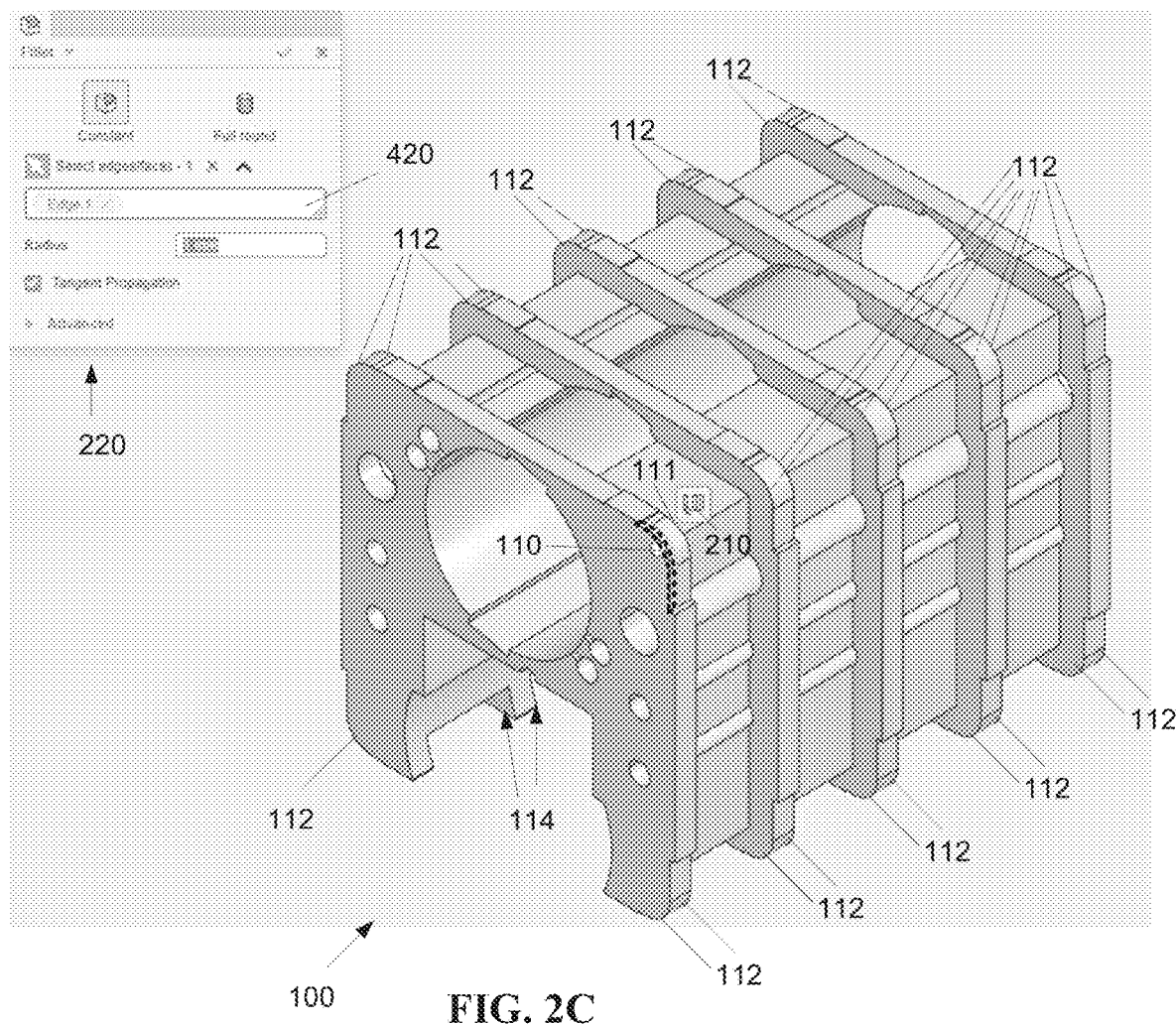
FIG. 2C is a screen capture of the 3D modeled object of FIG. 2A showing a selection helper icon near a selected seed edge of the 3D modeled object.

The Selection Helper module is represented to the user via one or more user interface (UI) graphical objects. FIG. 2A shows a 3D modeled object 100, in this example, a motor mount. FIG. 2B is a detail showing a first edge 110 (surrounded by a dashed line) and a second edge 111 and the resultant fillets. When the user selects the first fillet edge 110, for example via a mouse click, as shown by FIG. 2C a fillet/chamfer command dialog box 220 is displayed next to the 3D modeled object 100. Upon selection, the first fillet edge is referred to as the seed edge 110.

As shown by FIG. 2C, when designing fillets and chamfers a Selection Helper icon 210 is presented when the edge selection field is activated. When the user selects an edge 110 for filleting or chamfering, a small unobtrusive UI selector, for example a Selection Helper icon 210, is presented near the mouse cursor (not shown). The user may either ignore the Selection Helper icon 210, in which case the Selection Helper module is not launched; or he can click on the Selection Helper icon 210 to launch the Selection Helper module, as represented for example as a dialog box 250, referred to herein as the Selection Helper suggestions box 250, as shown in FIG. 3A.

Once launched, the Selection Helper suggestions box 250 replaces the Selection Helper icon 210 (FIG. 2C). The Selection Helper suggestions box 250 initially appears in a compact mode. A detail of the Selection Helper suggestions box 250 in compact mode is shown in FIG. 3B. In compact mode, the Selection Helper suggestions box 250 shows up with a very small and simple UI panel, including a grip area 310, a settings icon 312, an accept suggestions icon 314, and a reject suggestions icon 316. All the option settings (described below, see FIG. 3C) are hidden from the user by the Selection Helper suggestions box 250 in compact mode.

During the modeling process, when the user selects the seed edge 110, the Selection Helper module uses a nearest neighbors search technique described further below to analyze various edges 110, 111, 112 of the modeled object 100 to provide the user with the most likely suggestions 112 that one may want to select based on the selected seed edge 110.

Figure 2D:
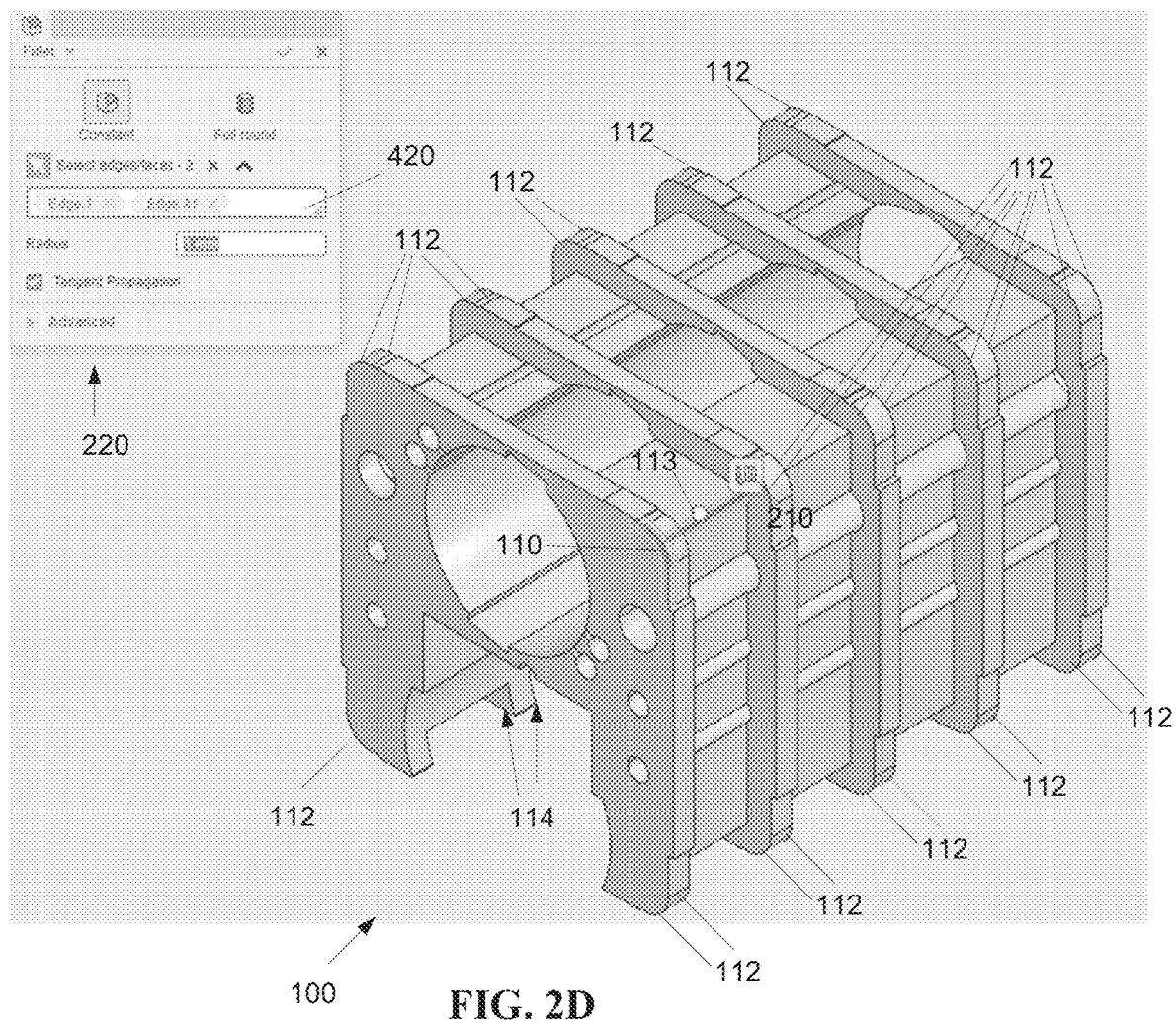
FIG. 2D is a screen capture of the 3D modeled object of FIG. 2A showing a selection helper icon near two selected seed edges of the 3D modeled object.
Figure 2E:
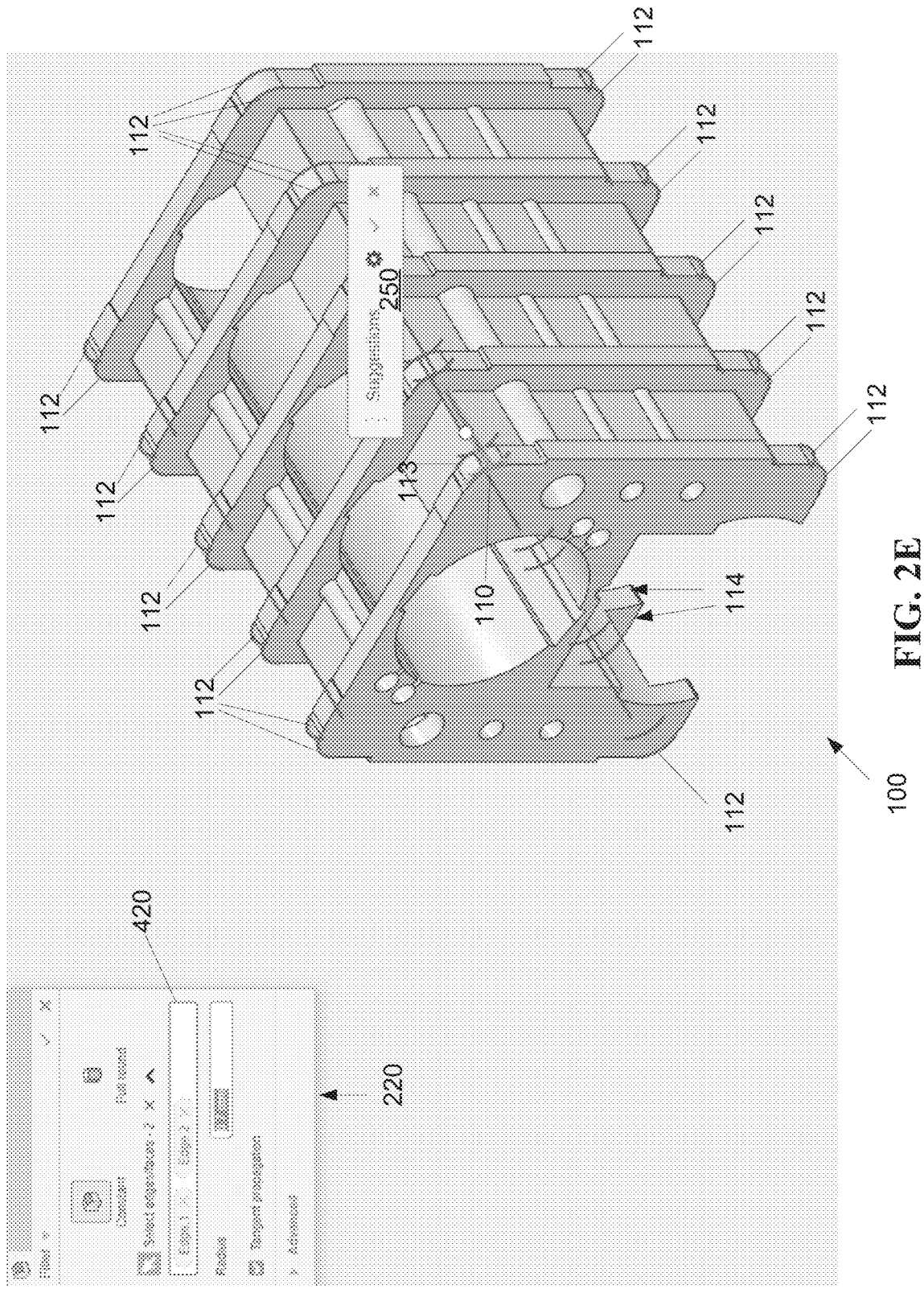
FIG. 2E is a screen capture of the 3D modeled object of FIG. 2A showing suggestion proposals based on the two selected seed edge portions of the seed edge.
Figure 2F:
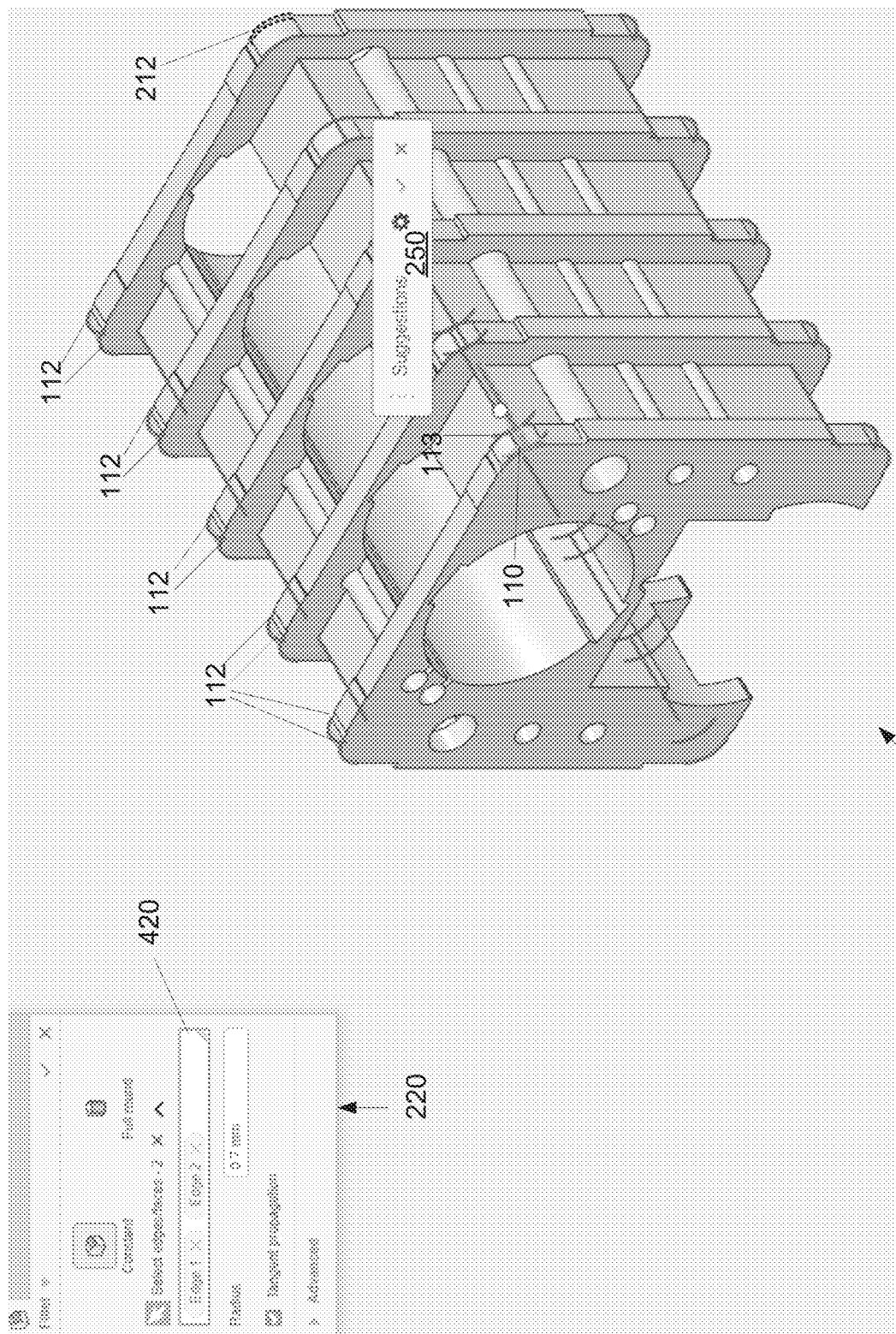
FIG. 2F is a screen capture of the 3D modeled object of FIG. 2A showing a rejected suggestion edge.
Figure 3A:
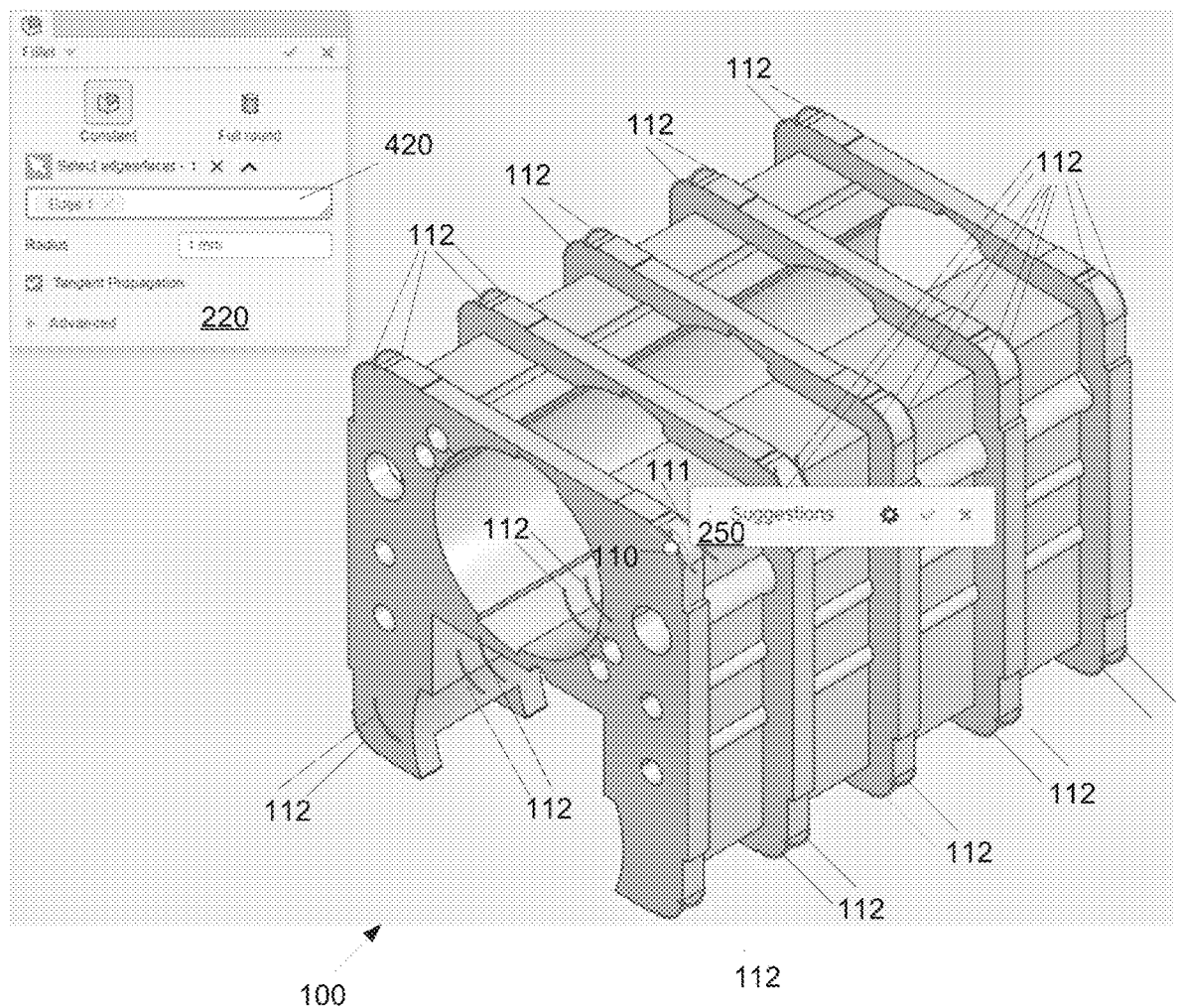
FIG. 3A is a screen capture of the 3D modeled object of FIG. 2C showing a selection helper dialog and plurality of suggested edges based on the selected seed edge.
Figure 3B:
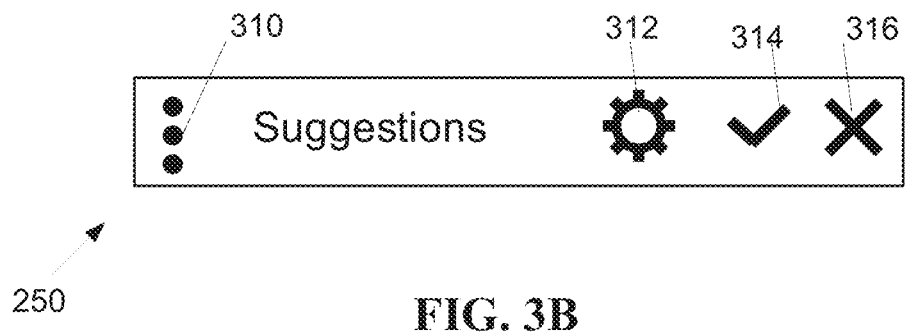
FIG. 3B is a schematic diagram of the compacted selection helper dialog of FIG. 3A.
Figure 4:
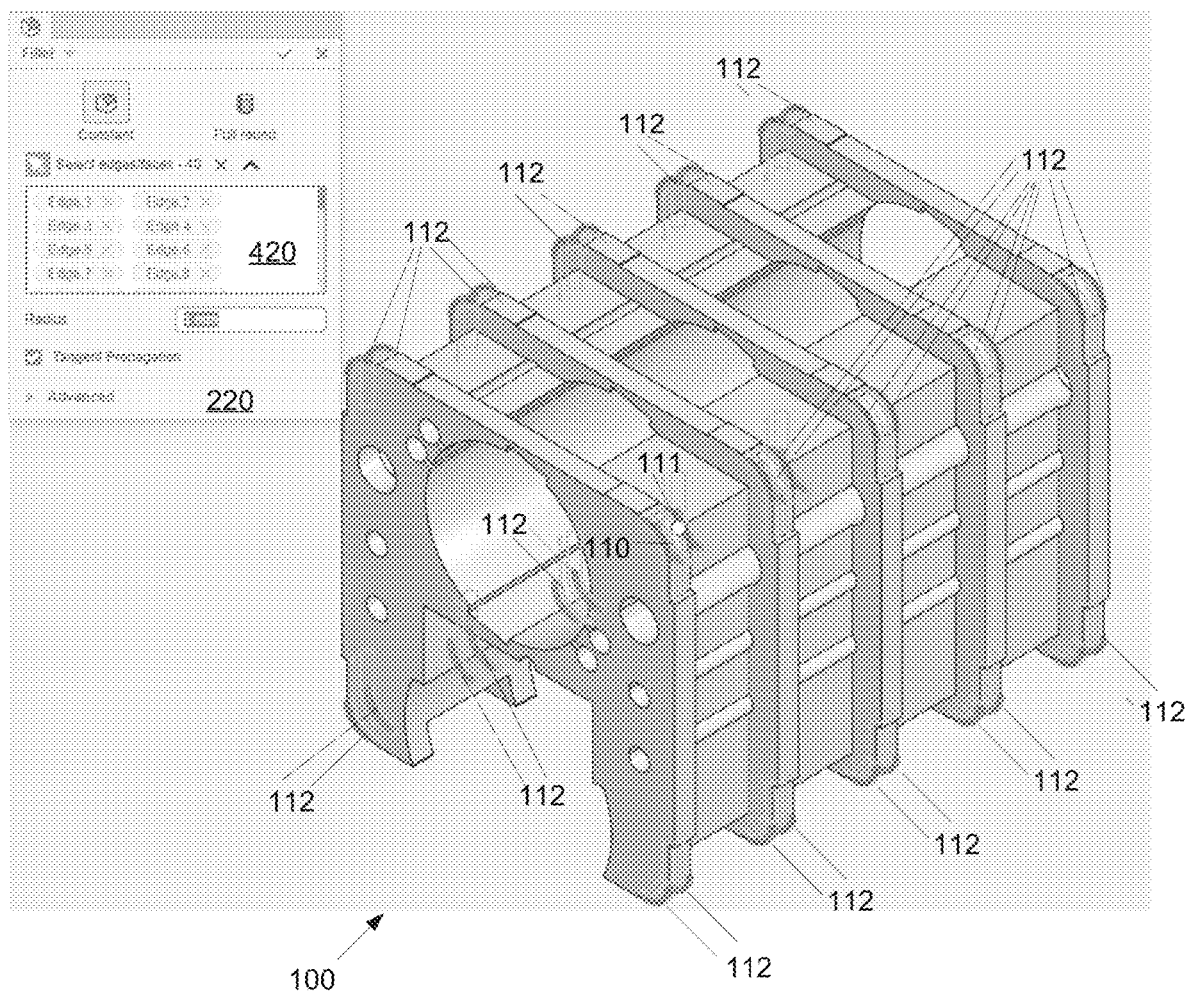
FIG. 4 is a screen capture of the 3D modeled object of FIG. 3 showing accepted selections.

As seen in FIG. 3A, these selections 112 are highlighted in color (shown in a thick line here) in the graphics area for easy visualization, and the user can make further modifications to the selections 112 by either adding new selections or removing any of the suggested selections. The color edge suggestions 112 distinguish them from the seed edge 110 that was directly selected by the user. As shown by FIG. 4, suggested edges 112 or faces are displayed even if they are located on the back side of the 3D modeled object 100, so that the model 100 does not have to be turned to display a hidden edge/face. Once the Selection Helper module has proposed the initial suggestions 112, the user has the option to either extend the suggestions or curtail the suggestions. To extend the suggestions, the user clicks on any edge that is currently unselected by the user provided it is also not proposed by the Selection Helper i.e. not highlighted in color (brown). For example, returning to FIG. 2C, a single edge 110 is selected, namely "Edge 1" which appears in a selection box 420 of the fillet/chamfer command dialog 220. In FIG. 2D, by clicking on another edge, namely a second edge 113, the seed edge is expanded to include both edges 110 and 113, and both edges appear in the selection box 420 of the fillet/chamfer command dialog 220. As shown by FIG. 2E, subsequent selection of the Selection Helper icon 210 results in the Selection Helper indicating (in color (brown)) suggestion proposals based on the two selected portions of the seed edge 110, 113. Returning again to FIG. 2C, if the user does not want a selected edge 112, the user may click on the individual edge to reject it, for example, a rejected suggestion 212 shown in FIG. 2F. The rejected suggestion 212 is then displayed in a lighter color tone, for example a lighter color brown (shown here in short dashed outline) from the other suggested edges 112. If the user has mistakenly clicked on the suggestion 112, then the user can re-accept the rejected selection 212 by clicking on it again, which turns the edge back from the lighter color tone to the darker color tone. Once the desired set of suggested edges 112 are appropriately adjusted, the user may click the check mark (accept suggestions icon) 314 in the Selection Helper suggestions box 250 to confirm the selection of all the suggested edges 112 to the fillet/chamfer command box 220. As shown by FIG. 4, after confirming, the Selection Helper suggestions box 250 is removed from the display and the suggestions edges 112 are then presented alphanumerically in the selection box 420 of the fillet/chamfer command dialog 220.

Returning to FIG. 3A, If the user does not wish to use the suggested edges 112, clicking the X-shaped reject suggestions icon 316 of the Selection Helper suggestions box 250 discards the suggestions shown in color (brown), closes the Selection Helper dialog and returns the user back to the fillet/chamfer command dialog 220 without making any changes to the original suggestions displayed in the selection box 420 of the fillet/chamfer command dialog 220 as shown by FIG. 4.

Figure 3C:
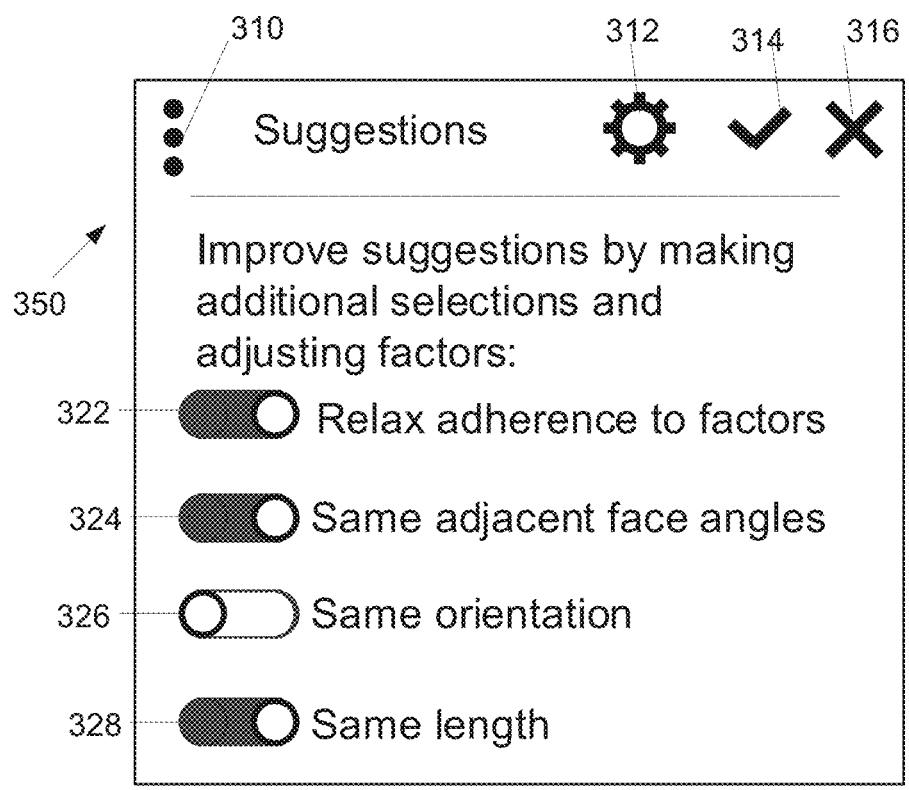
FIG. 3C is a schematic diagram of an expanded selection helper dialog.

As shown by FIG. 3C, if the user chooses to refine the suggestions, clicking the Settings icon 312 reveals an expanded selection helper dialog 350 having a set of options 322, 324, 326, 328 that the user may adjust. As the user changes the various options 322, 324, 326, 328, suggestions made by the Selection Helper are varied dynamically and displayed to the user promptly. Under the first embodiment, the options include a "relax adherence to factors" option 322 that allows the user to specify whether he wants the seed edge 110 to be compared with the other (non-selected) edges in the model 100 with a relaxed tolerance or a strict tolerance. This is described further below in more detail. A length option 328 causes the Selection Helper to consider edge length as a feature to be used in the comparison of the seed edge 110 with the other edges in the model 100 and make suggestions accordingly. An orientation option 326 causes the Selection Helper to consider edge orientation a feature to be used in the comparison of the seed edge 110 with the other edges in the model 100 and make suggestions accordingly. Edge orientation includes the vector direction of the tangents at the start and end points of the edge 110. A same adjacent face angles option 324 causes the Selection Helper to consider one or more angle between faces adjacent to the seed edge 110 as a criterion in comparing edges. In addition, there is an internal geometry option (not shown) to select edges based on the geometry of the seed edge 110 which is always 'ON' and is not shown in the UI. With the geometry option ON, while making suggestions, the Selection Helper takes into account features such as angles made by tangents with the seed edge 110 at the start and end points, and also curvatures of the seed edge 110 at its start and end points.

Figure 6:
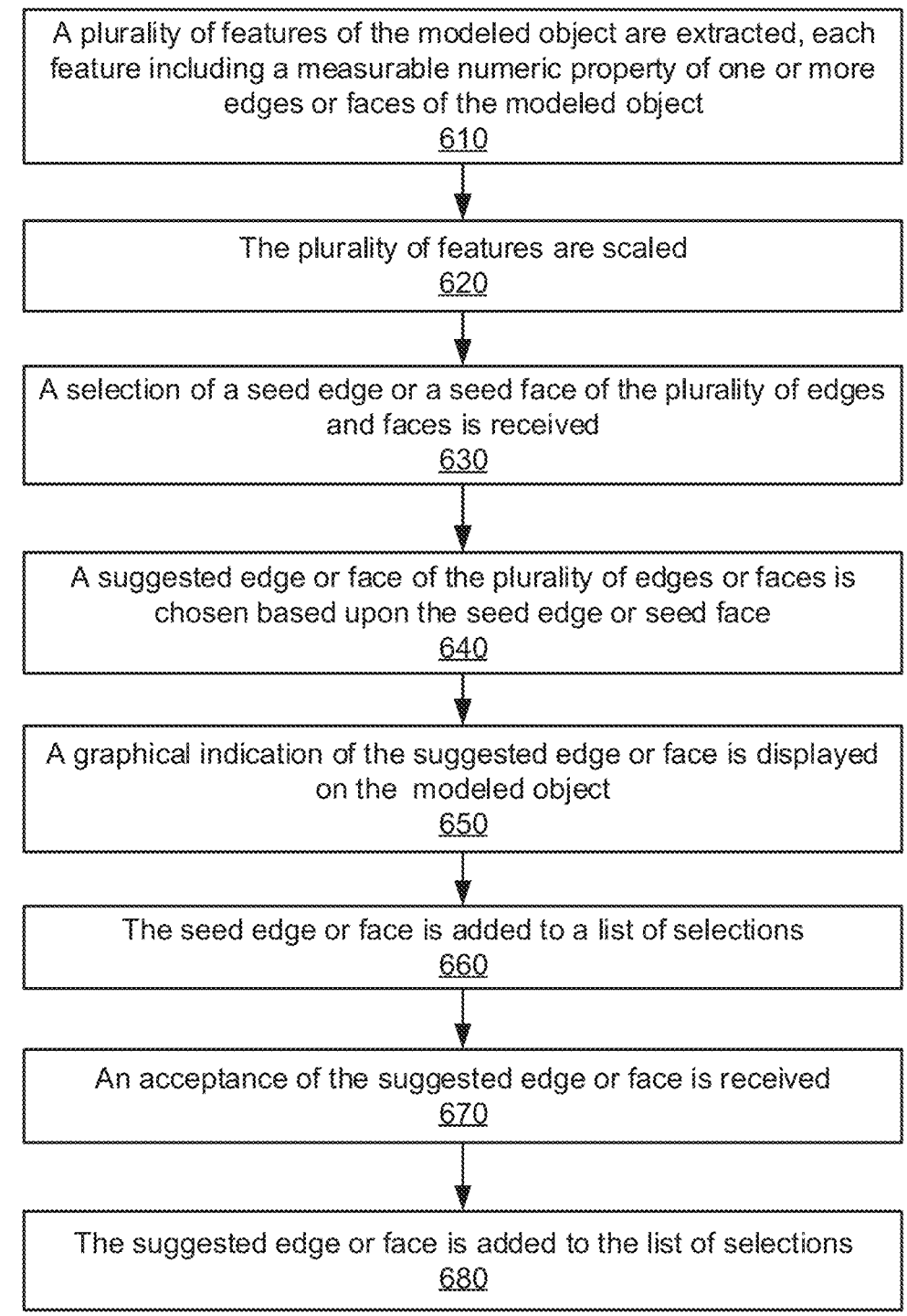
FIG. 6 is a flowchart of a first embodiment of an exemplary method for selecting similar edges of a 3D object.

FIG. 6 is a flowchart 600 of a first embodiment of an exemplary method for selecting similar edges of a modeled object in a computer-aided design system. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A plurality of features of the modeled object are extracted, each feature including a measurable numeric property of one or more edges or faces of the modeled object, as shown by block 610. The plurality of features are scaled, as shown by block 620. Preferably, the features are extracted from every edge and face of the modeled object. A selection of a seed edge or a seed face of the plurality of edges and faces is received, as shown by block 630, for example, after a user indicates the seed edges or the seed faces by clicking on a corresponding displayed portions of the modeled object. The seed edges or the seed faces are indicated on the modeled object with a first color. A suggested edge or face of the plurality of edges or faces is chosen based upon the seed edge or seed face, as shown by block 640. The plurality of edges or faces may be chosen using a nearest neighbor search technique described further below. A graphical indication of the suggested edge or face is displayed the modeled object as shown by block 650, for example, by displaying the suggested edges and faces in a second color. The seed edge or face is added to a list of selections, as shown by block 660, for example, a list of edges to be filleted. An acceptance of the suggested edge or face is received, as shown by block 670, for example, in response to a user accepting the suggested edges or faces via a dialog box. The suggested edge or face is added to the list of selections, as shown by block 680 where new topological features of the modeled object may be created based on the list of selections, or an existing topological feature of the modeled object may be modified based upon the list of selections.

The Selection Helper module incorporates several techniques to implement the above described functionality. For feature extraction 610 (FIG. 6), the Selection Helper module extracts a set of features from every edge or face in the modeled object. The chosen features can be extracted by the Selection Helper with very little CPU usage, yet they have sufficient discriminative power. Here, discriminative power refers to the ability to differentiate between similar and dissimilar edges/faces in the same 3D modeled object, which is described in more detail below.

Once a feature extraction operation has been performed on a specific edge or a face, no subsequent feature extraction operation is needed until that edge or face is subsequently modified. For example, in many cases the majority edges and faces in a 3D modeled object remain intact after a modification. Only certain edges and faces are modified or are deleted or new edges and faces are added. In order to not repeat the computations that were already performed, feature extraction is only performed incrementally, and only for those edges and faces that are either changed or newly added. This reduces the wastage of CPU time. The Selection Helper module deletes feature vectors that are not used, for example, feature vectors of edges and faces that no longer exist after an edit. This reduces the wastage of occupied computer memory.

For feature scaling 620 (FIG. 6), the Selection Helper module performs a standard feature scaling process, familiar to those having skill in the art in data science. Feature scaling is the process of normalizing the ranges of each feature. Here, the Selection Helper module employs min-max feature scaling to scale the range of all extracted features in the range of 0 to 1. Then the Selection Helper module flattens out all the scaled values into a single dimensional vector (called the "feature vector").

For choosing suggested edges or faces (block 640 (FIG. 6)) the Selection Helper module employs a nearest neighbors search on the extracted feature vectors. The nearest neighbors search is a common class of methods used to find the most similar elements, given any dissimilarity metric/function. The Selection Helper module uses a specific variant of the nearest neighbors search, called Fixed-radius Near Neighbors, which searches for all elements that are similar to a given element within a specified radius/tolerance.

The Selection Helper module uses $L^2$ norm (also known as $L^2$-distance or Euclidean distance or Euclidean metric) as the dissimilarity function to be used in Fixed-radius Near Neighbors, and may use well-known space partitioning data structures such as ball trees or k-d trees for reducing the computation time. The radius/tolerance is decided based whether the user has set "Relax adherence to parameters" ON or OFF. For example, the Selection Helper module may use a tolerance of 0.1 (i.e. allow 10% dissimilarity) when "Relax adherence to parameters" is ON, or use a tolerance of 0.01 (i.e. allow 1% dissimilarity) when "Relax adherence to parameters" is OFF.

Alternatively, the user may be allowed to directly specify what percentage of dissimilarity is to be allowed. The Selection Helper module uses fixed-radius Near Neighbors to find all the edges or faces in the 3D modeled object similar to the seed edges or seed faces. Because the Selection Helper module converts the problem of finding similar edges or faces into a 'Nearest Neighbors Search' problem, the Selection Helper module leverages the well-known performance optimizations techniques on it, such as ball trees or k-d trees that may help reduce the complexity of the search algorithm from $O(N^2)$ to $O(\log n)$. The choice of the features that the Selection Helper module extracts is such that the features are extracted very quickly (with very little CPU usage), yet have sufficient discriminative power. Here, discriminative power means the ability to differentiate between similar and dissimilar edges/faces in the same 3D modeled object.

Figure 7A:
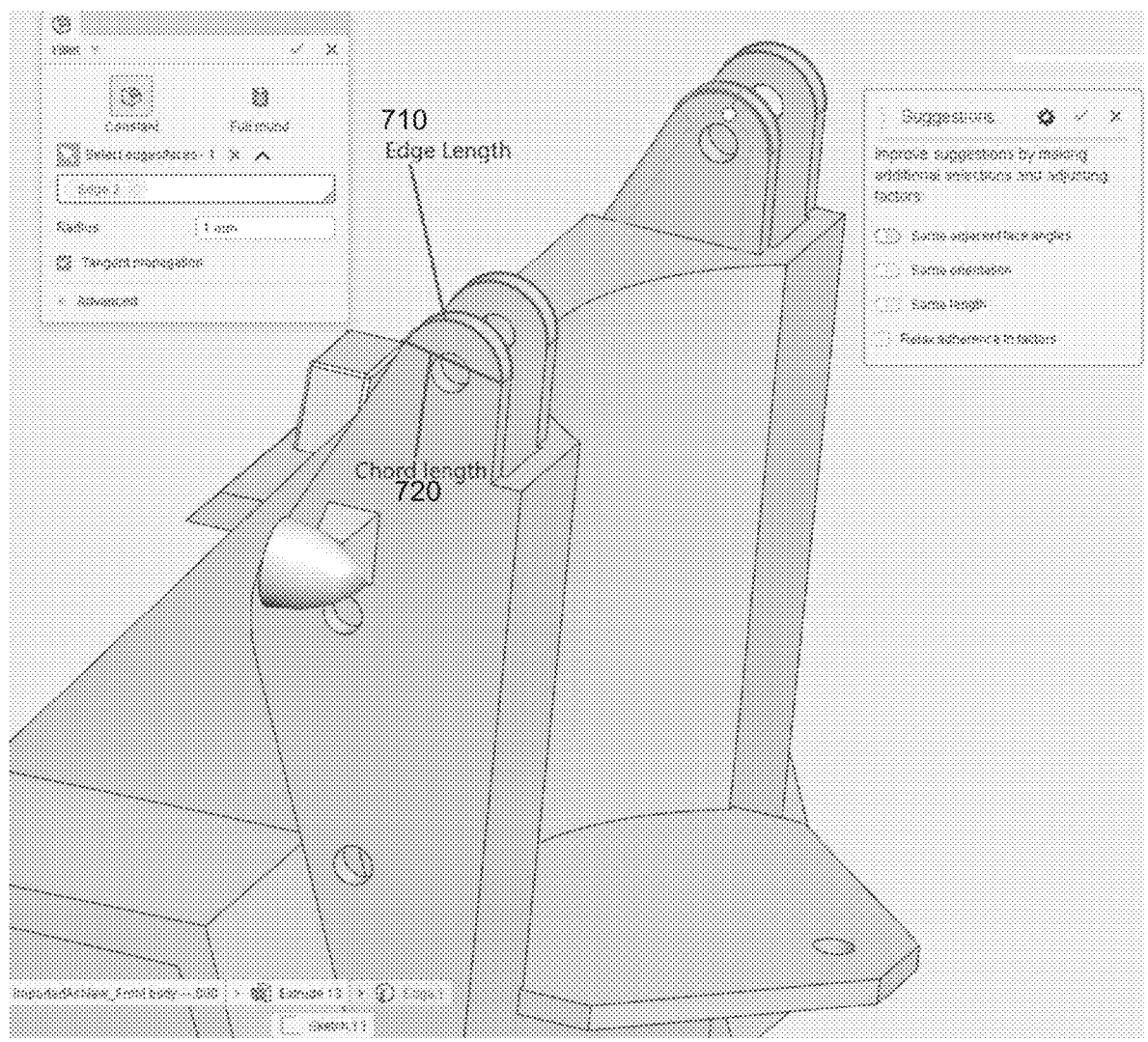
FIG. 7A is a screenshot showing an example of edge length vs. chord length.

The Selection Helper module selects the following features to be extracted from every edge:

Edge length 710 (FIG. 7A): [one real number] The distance along the curve from the start of the edge to the end of the edge (see FIG. 7A), as distinguished from the chord length 720, a straight line between the start and end of an arc.

Figure 7B:
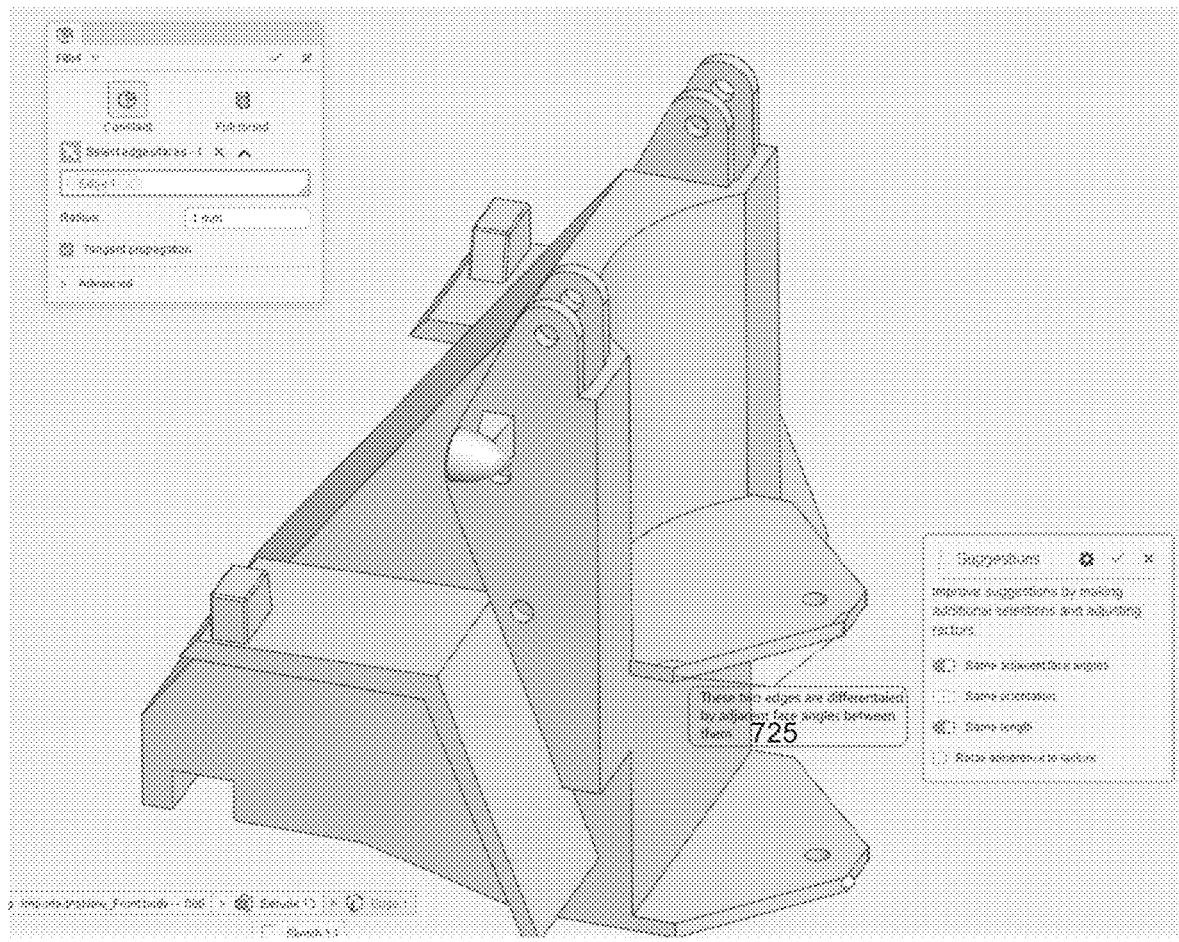
FIG. 7B is a screenshot showing an example of adjacent face angles.
Figure 7C:
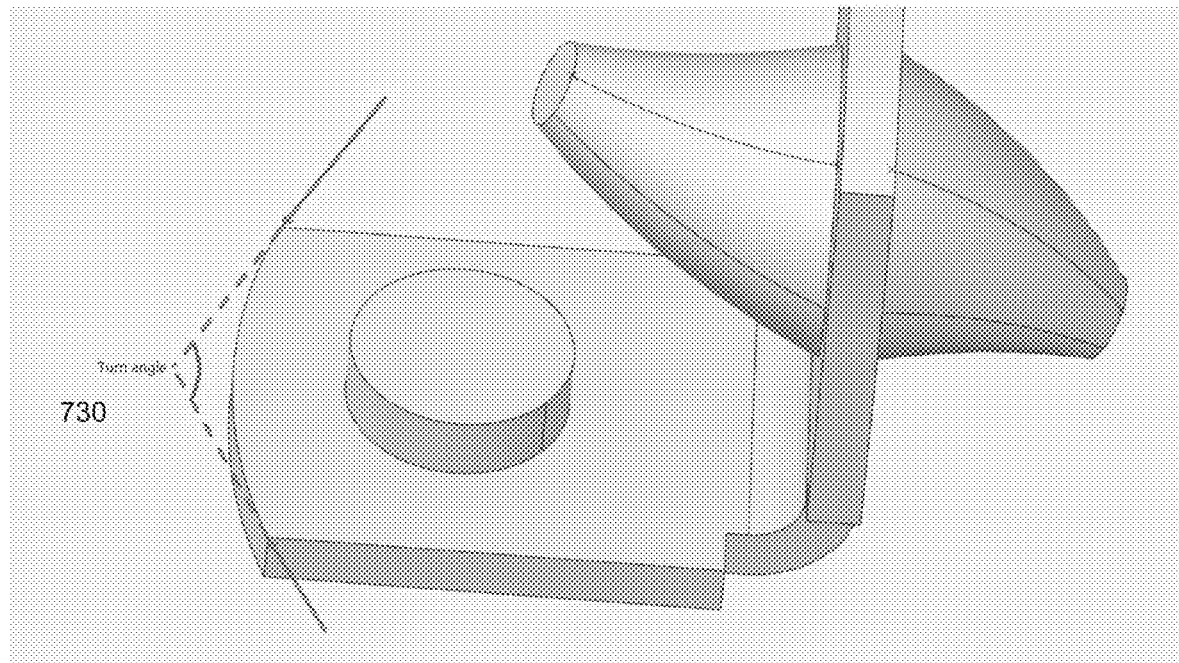
FIG. 7C is a screenshot showing a first example of a turn angle.
Figure 7D:
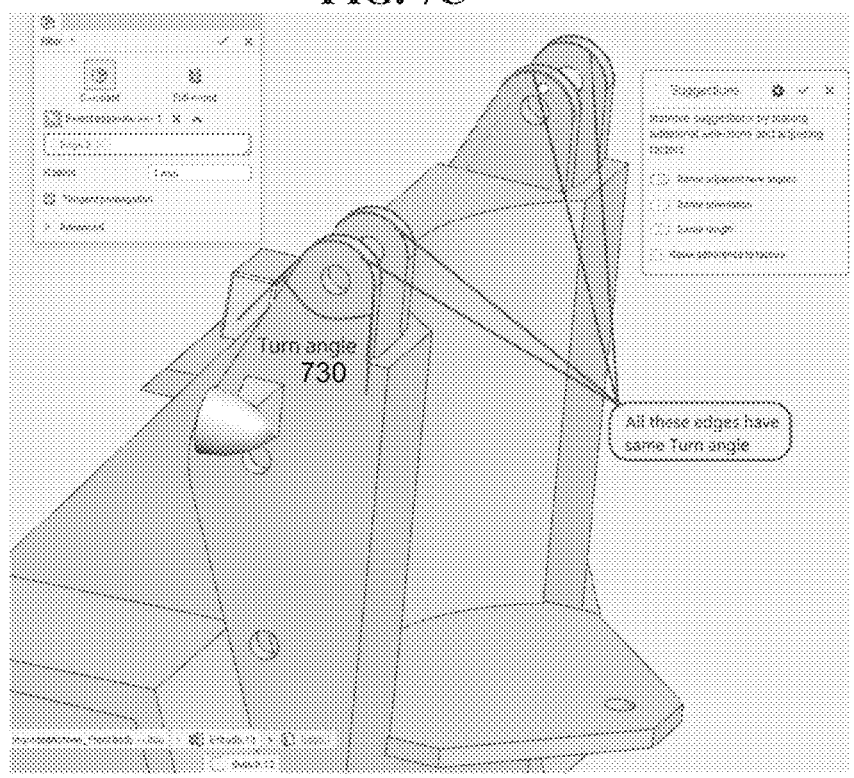
FIG. 7D is a screenshot showing a second example of a turn angle.

Adjacent face angles 725 (FIG. 7B): [two real numbers] Angles between the two faces adjacent to the edge measured on the matter-side at the start of the edge and the end of the edge. These angles can range from 0 to 360 degrees. If the edge is convex, these angles are smaller than 180 degrees and if the edge is concave, then these angles are larger than 180 degrees. This feature conveys how convex or concave the edge is at both start and the end of the edge Turn angle 730 (FIGS. 7C, 7D): [one real number] This is the angle between the start direction of the edge and the end direction of the edge. This angle indicates how much the edge turns.

Curvature: [two real numbers] Curvature of the edge at its start and end. This feature indicates how sharply the edge turns at its start and end.

Ratio of the edge length 710 to the chord length 720: [one real number] Chord length means the straight line distance between start point and the end point of the edge. This ratio is a strong characteristic of the shape of the curve.

Three principal moments of inertia: [three real numbers] These are calculated by finding eigenvalues of the inertia matrix of the edge (considering the edge as a thin solid wire). The principal moments of inertia depend on the shape of the edge and help add to the discriminative power of the features.

Vertex Angles: [four real numbers]
Angle between the start direction of the current edge and the end direction of the previous edge on the left face.
Angle between the start direction of the current edge and the end direction of the previous edge on the right face.
Angle between the end direction of the current edge and the start direction of the next edge on the left face.
Angle between the end direction of the current edge and the start direction of the next edge on the right face.

Orientation vectors: [six real numbers] This feature is only included in the feature vector if the user has turned the "Same Orientation" option ON.
x, y and z coordinates of the start direction of the edge.
x, y and z coordinates of the end direction of the edge. The end direction of the edge is the direction, expressed as a unit vector in 3D, of the tangent to the edge, at the end of the edge, pointing outwards (i.e. towards the outside direction of the edge).

Each of these features can be extracted with relatively little CPU usage.

As used within this disclosure, the start or the end direction of an edge refers the direction of the tangent to the edge, at the start point or the end point of the edge respectively. Per this convention, both the start and the end directions point outwards from the edge. Both the start and end directions are expressed as a unit vector in three dimensions.

Computing the exact edge length and the principal moments of inertia can sometimes be performance intensive, especially for edges with complex representations. However, most CAD systems keeps a light-weight edge representation (used for visual rendering of the edge) in the form of poly-line (a chain of line segments) that approximates the edge shape. The approximate edge length and the approximate principal moments of inertia may be computed relatively quickly using this approximate representation. Often, CAD systems also keep a cache of such frequently used measures that are time-consuming to use. A cache can also be used if available.

In previous CAD systems, problem may have arisen due to edge parametrization direction: In CAD systems, an edge is represented in a parametric form. The tangent direction at any point on the curve is taken to be in the direction of the increasing parameter value. Depending on the parametrization direction, the resulting tangent direction could be one way or the opposite. As a result, the tangent directions of two identical edges with opposite parametrization directions may be reverse of one another causing their feature vectors to not match.

To address this issue, the embodiments compute not just one feature vector, but a pair of feature vectors, for every edge. The second feature vector is computed for the reverse parametrization of the same edge (i.e. considering the end of the edge as the start, and the start of the edge as end). This ensures that between two identical edges, irrespective of their parametrization direction, at least one of their feature vectors will match and that our algorithm becomes independent of the parametrization direction.

The selection helper module selects the following features to be extracted from every face:
Face area: [one real number] The area bounded by one or more bounding loops of face.
Ratio of the face area to the square of its perimeter: [one real number] where perimeter indicates the sum of the lengths of all the bounding edges of the face.
Three principal moments of inertia: [three real numbers] The selection helper module calculates these by finding the inertia matrix of the face (considering the face as a thin lamina) as eigenvalues. The principal moments of inertia depend on the shape of the face and help add to the discriminative power of the selection helper module.

Average orientation: [three real numbers] This feature is included in the feature vector only if the user has turned the "Same Orientation" option ON. For this the selection helper module calculates x, y and z coordinates of average of the face normal directions computed at each vertex of the face. The face normal direction at any point on the face is expressed as a unit vector in 3D, pointing outwards, i.e. away from the matter-side of the face.

It should be noted that computing the exact face area and the principal moments of inertia can sometimes be performance intensive, especially for faces with complex geometric representations. However, most CAD systems keeps a light-weight face representation (used for visual rendering of the face) in the form of triangulated mesh (a set of connected triangles) that approximates the face shape. This approximate representation allows the selection helper module computes an approximate face area and the approximate principal moments of inertia relatively quickly. If available, the CAD system may also keep a cache of such frequently used time-consuming measures.

Figure 5:
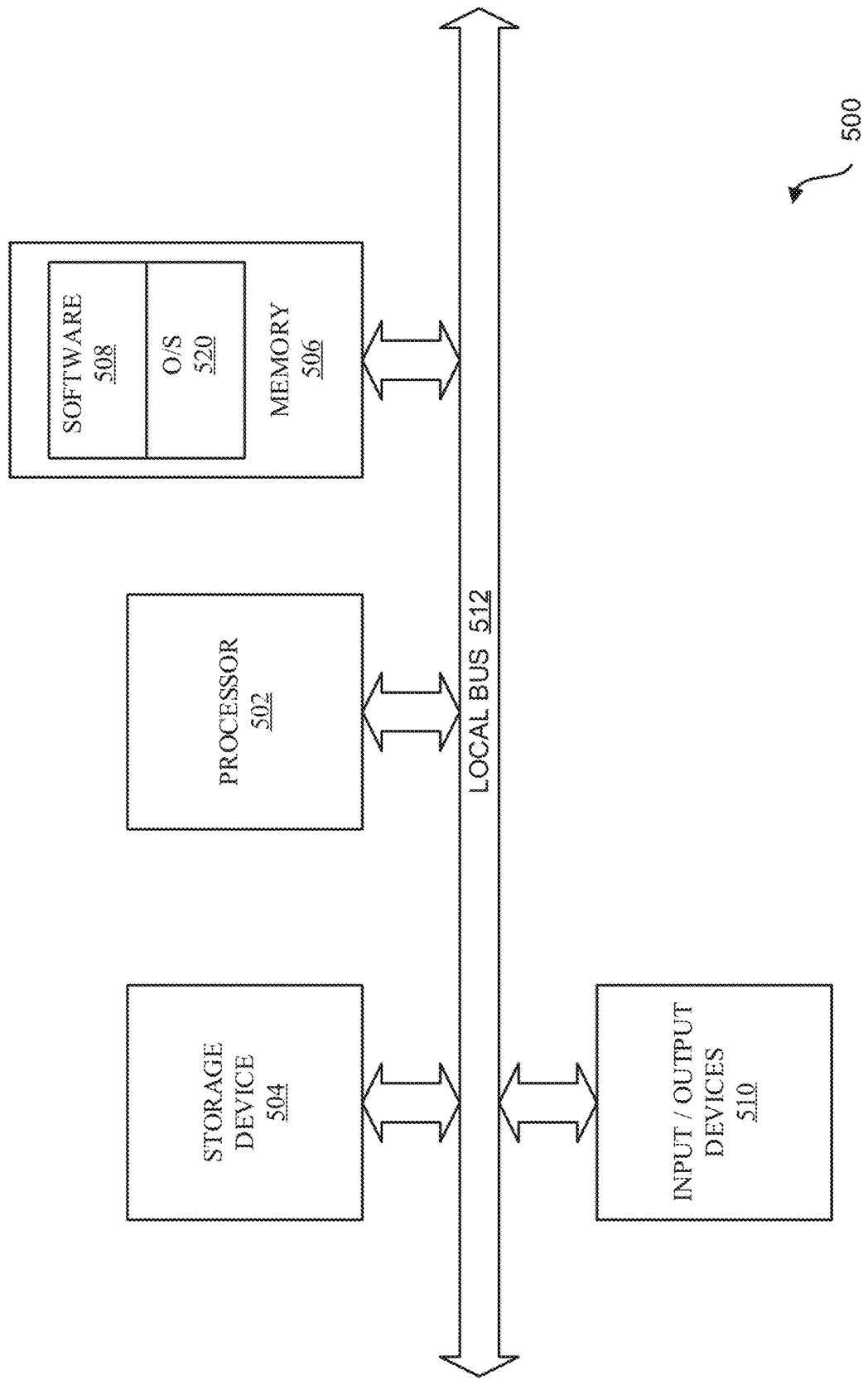
FIG. 5 is a schematic diagram illustrating an example of a system for executing functionality of the present invention.

The present system for executing the functionality of the Selection Helper module described in detail above may be a computer, an example of which is shown in the schematic diagram of FIG. 5. The system 500 contains a processor 502, a storage device 504, a memory 506 having software 508 stored therein that defines the abovementioned functionality, input and output (I/O) devices 510 (or peripherals), and a local bus, or local interface 512 allowing for communication within the system 500. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a macroprocessor, or generally any device for executing software instructions.

The memory 506 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

When the functionality of the system 500 is in operation, the processor 502 is configured to execute the software 508 stored within the memory 506, to communicate data to and from the memory 506, and to generally control operations of the system 500 pursuant to the software 508. The operating system 520 is read by the processor 502, perhaps buffered within the processor 502, and then executed.

When the system 500 is implemented in software 508, it should be noted that instructions for implementing the system 500 can be stored on any computer-readable medium for use by or in connection with any computer-related device, system, or method. Such a computer-readable medium may, in some embodiments, correspond to either or both the memory 506 or the storage device 504. In the context of this document, a computer-readable medium is an electronic, magnetic, optical, or other physical device or means that can contain or store a computer program for use by or in connection with a computer-related device, system, or method. Instructions for implementing the system can be embodied in any computer-readable medium for use by or in connection with the processor or other such instruction execution system, apparatus, or device. Although the processor 502 has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the processor or other such instruction execution system, apparatus, or device.

Such a computer-readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the system 500 is implemented in hardware, the system 500 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 8A:
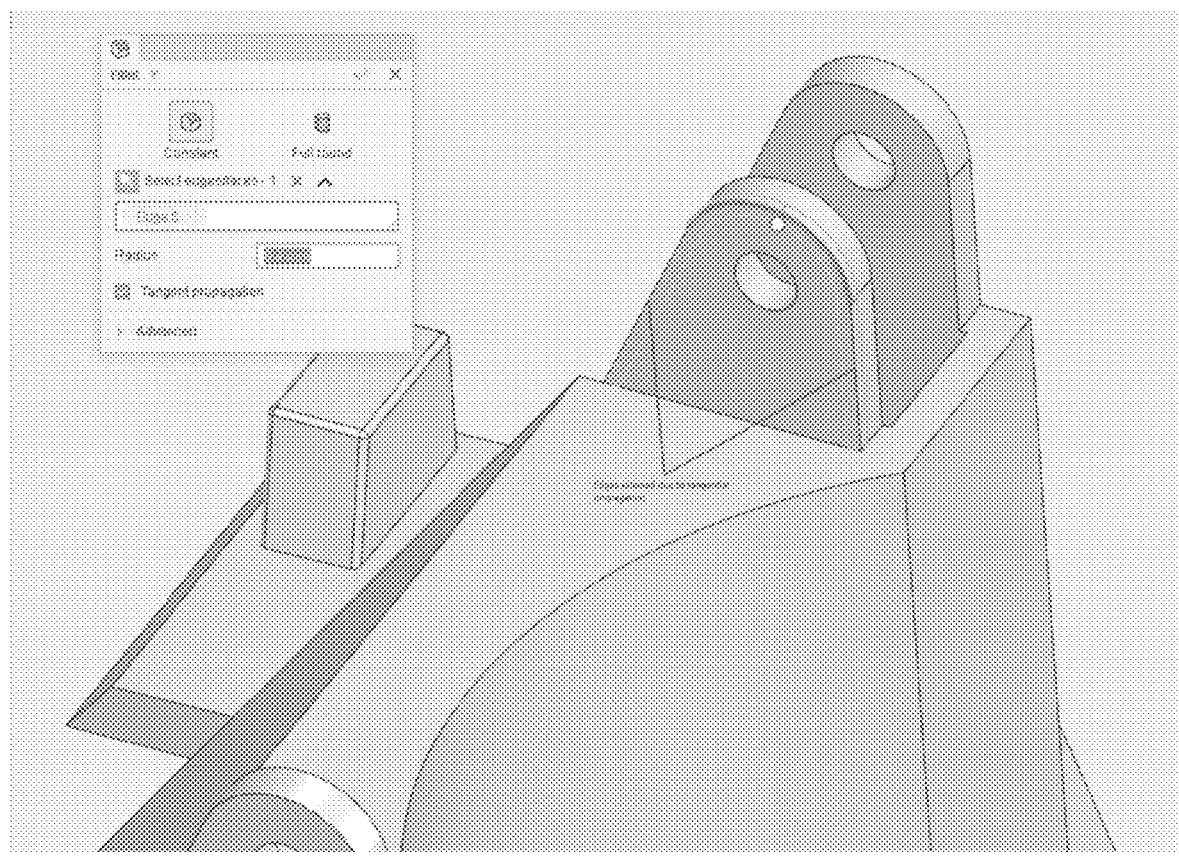
FIG. 8A is a screenshot showing an example of an existing tangent propagation edge/surface selection.

The embodiments described above offer advantages over several previous methods for selecting edges in a 3D modeled objects, examples of which are described below. FIG. 8A shows an example of tangent propagation. When a user selects an edge to fillet or chamfer, the CAD system automatically selects a chain of tangentially connected edges of which the selected edge is a part. However, only edges that are tangentially connected to the selected edge can selected. Other similar edges in the 3D modeled object cannot be selected.

Figure 8B:
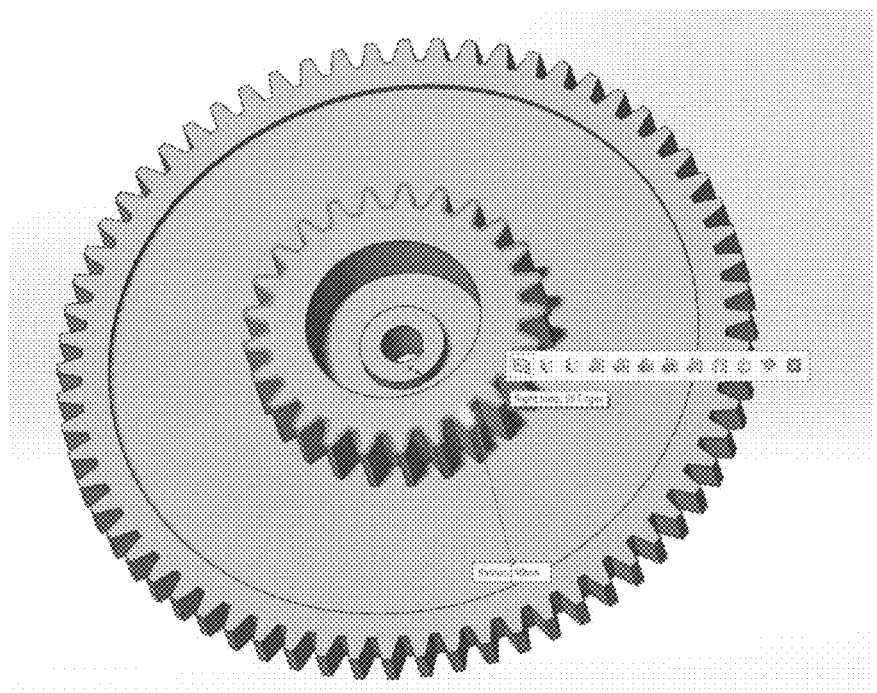
FIG. 8B is a screenshot showing an example of an existing method for selecting all edges/surfaces that share the same boundary.

FIG. 8B shows an example of selecting all edges that share the same boundary. When a user selects an edge, the CAD system allows the user to extend the selection to all edges that share the same face boundary (also called loop) as the user selected edge. However, here only edges that share the same face boundary as the selected edge can selected. Other similar edges in the 3D modeled object are not selected.

Figure 8C:
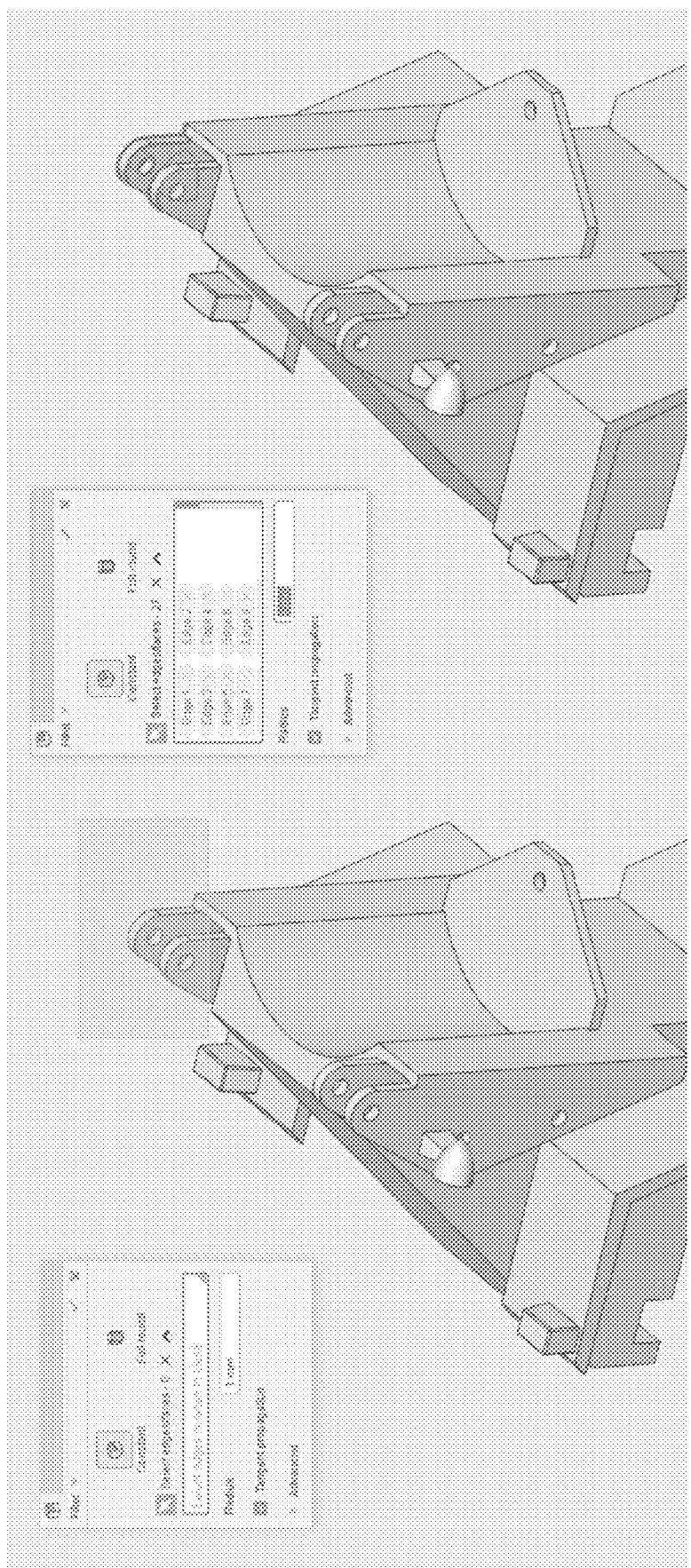
FIG. 8C is a screenshot showing an example of an existing edge/surface selection method of box selection.

FIG. 8C shows an example of box selection. Here, the user specifies a closed region (usually rectangular, but could be of any shape) on the computer screen and all the edges or faces that happen to be (partially or fully) inside that region are selected. However, this selection technique is not based on whether the edges/faces are similar in shape or size. As shown by FIG. 8C, depending upon the perspective of the displayed model, a box around two similar edges may result in dissimilar selections of similar edges.

Another previous selection technique searches for edges or faces that have identical data structures representations in the CAD system. However, this technique may fail because edges or faces that are identically shaped may not necessarily have identical data structure representation in the CAD system. For example, a linear edge or circular edge can be represented directly by its mathematical equation, but it can also be represented by a NURBS (non-uniform rational basis-splines). Moreover, two different NURBS representations may represent 3D curves that are identical in shape. Therefore, searching for identical data structure representations is an error-prone technique of searching identical shapes.

Further, typical modern day CAD Systems support complex procedural representation of curves and surfaces in which the geometry may be represented by a recursive evaluation procedure that may depend on multiple curve and surface definitions coming from previously created edges and faces. Determining whether the data structure representations of two procedurally represented curves or surfaces are identical may be complex and time-consuming. Also, searching for similar edges and faces for every edge and face in a given 3D modeled object is $O(N^2)$ algorithm whose performance does not scale up well for large models.

Point Sampling is another previously known technique for edge/surface selection. Without looking at their data structure representations, finding if two curves or surfaces are exactly identical is impractical because it involves testing for coincidence of infinitely many points per curve/surface. Consequently, the more commonly used search methods only attempt to determine whether the curves/surfaces are approximately similar rather than aiming for exact similarity. This is done by using point sampling. Several (a finite number of) points are sampled from one curve or surface, and then they are suitably transformed and tested to see if they lie on the other curve or surface. However, point sampling is time-consuming, because checking whether a point lies on a curve/surface (also called inversion) typically incorporates a costly iterative numerical algorithm. As a result, point sampling is not suitable for identifying similar edges during a real time user interaction, particularly for modeled objects with hundreds of edges. Here again, using point sampling to search for similar edges and faces for every edge and face in a given 3D modeled object is $O(N^2)$ algorithm whose performance does not scale well for large models.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for selecting edges or faces of a displayed modeled object in a computer-aided design (CAD) system according to a user selection of a seed edge or face, comprising the steps of:

extracting a plurality of features, each feature comprising a measurable numeric property of one or more of a plurality of edges or faces of the modeled object;

scaling the plurality of features;

receiving the user selection of a first edge or first face of the displayed model as a seed edge or a seed face of the plurality of edges and faces;

indicating via a graphical user interface (GUI) the seed edge or the seed face with a first graphical indication visually distinguishing the seed edge or the seed face from other faces or edges of the plurality of edges and faces in the displayed model;

choosing, by using a nearest neighbors search of all elements in the modeled object that are similar to the seed edge or seed face within a specified radius and/or tolerance, a suggestion comprising a suggested second edge or second face of the plurality of edges or faces based upon a first set of criteria for the seed edge or seed face; and displaying a second graphical indication via a GUI object indicating the suggestion on the displayed modeled object, wherein the second graphical indication of the suggestion and the first graphical indication of the seed edge or seed face visually distinguishes the suggestion from of the seed edge or seed face.

2. The method of claim 1, further comprising the steps of:

indicating the seed edge or face in a first color on the modeled object; and indicating the suggested edge or face in a second color on the modeled object.

3. The method of claim 1, further comprising the steps of:

adding the seed edge or face to a list of selections comprising one or more previous seed edge and/or face selections;

receiving an acceptance of the suggested edge or face; and adding the suggested edge or face to the list of selections.

4. The method of claim 3, further comprising the step of creating a new topological feature of the modeled object based on the list of selections.

5. The method of claim 3, further comprising the step of modifying an existing topological feature of the modeled object based upon the list of selections.

6. The method of claim 1, wherein scaling the plurality of features further comprises flattening the scaled features into a feature vector.

7. The method of claim 1, further comprising the steps of:

presenting, via the GUI in the context of the displayed model, a helper icon in the proximity of the indicated seed edge or seed face; and receiving a user selection of the helper icon, wherein the choosing of the suggested second edge or face is based upon the user selection of the helper icon.

8. The method of claim 7, further comprising the step of displaying via the GUI a suggestion box comprising a selection for modifying the first set of criteria for the seed edge or seed face for the nearest neighbor search.

9. The method of claim 1, further comprising the steps of:
receiving a user selection of a third edge or third face; and
extending the suggestion according to the third edge or third face.

10. The method of claim 9, further comprising the step of:
updating the first graphical indication to include the third edge or third face.

11. The method of claim 9, further comprising the step of:
updating the second graphical indication of the suggestion to include the third edge or third face.

12. The method of claim 1, wherein the extracting the plurality of features further comprises extracting for each edge:

an edge length;

an adjacent face angle between the edge and each of two faces adjacent to the edge;

a turn angle between a start direction and an end direction of the edge;

a curvature of the edge at each of an edge start and an edge end;

a ratio of the edge length to a chord length between the edge start and the edge end; and a principal moment of inertia of the edge.

13. The method of claim 1, wherein the extracting the plurality of features further comprises extracting for each face:

a face area;

a ratio of the face area to a square of a perimeter of the face; and a principal moment of inertia of the face.

* * * * *